United States Patent [19]

Dugan

[11] Patent Number: 4,564,423
[45] Date of Patent: Jan. 14, 1986

[54] PERMANENT MANDREL FOR MAKING BUMPED TAPES AND METHODS OF FORMING

[75] Inventor: William P. Dugan, Pomona, Calif.

[73] Assignee: General Dynamics Pomona Division, Pomona, Calif.

[21] Appl. No.: 675,791

[22] Filed: Nov. 28, 1984

[51] Int. Cl.⁴ .................. C25D 1/20; C25D 1/22; C25D 17/10
[52] U.S. Cl. ........................... 204/12; 204/281
[58] Field of Search ............ 204/11, 12, 3, 4, 6, 204/281, 37.6

[56] References Cited

U.S. PATENT DOCUMENTS

| | | | |
|---|---|---|---|
| 1,930,826 | 10/1933 | Scott | 204/6 |
| 2,287,123 | 6/1942 | Norris | 204/11 |
| 2,692,190 | 10/1954 | Pritikin | 204/11 |
| 3,230,163 | 1/1966 | Dreyfus | 204/281 |
| 3,350,250 | 10/1967 | Sanz et al. | 156/150 |
| 3,424,658 | 1/1969 | Norton | 204/15 |
| 3,508,980 | 4/1970 | Jackson, Jr. et al. | 29/572 |
| 3,566,461 | 3/1971 | Carbonel | 29/604 |
| 3,583,066 | 6/1971 | Carbonel | 29/604 |
| 3,833,482 | 9/1974 | Jacobus | 204/281 |
| 3,913,223 | 10/1975 | Gigoux | 29/625 |
| 4,125,441 | 11/1978 | Dugan | 204/12 |

Primary Examiner—T. M. Tufariello
Attorney, Agent, or Firm—Henry M. Bissell; Edward B. Johnson

[57] ABSTRACT

Reusable mandrels for fabricating bumped circuit base sheets may be formed by alternative methods. One method involves the selective etching of a copper sheet to develop pits or cavities at predetermined locations. A thin plating layer is deposited on the base sheet, covering the surface including the depressions to form the mandrel. After passivation of the plated surface, copper is plated thereon to form the sheet with the bumps in place. This sheet is then peeled off the mandrel so that the mandrel may be reused for making subsequent bumped sheets. An alternative method of forming the reusable mandrel involves the selected build-up of a base metal sheet by plating with a compatible material about islands of photoresist. Thereafter, the photoresist is removed, leaving cavities where the islands had been. This surface is then plated with a thin layer of nickel to form the permanent mandrel.

16 Claims, 10 Drawing Figures

PERMANENT MANDREL FOR MAKING BUMPED TAPES AND METHODS OF FORMING

BACKGROUND OF THE INVENTION

1. Field of the Invention

The present invention generally relates to the forming of bump and lead circuits of the type which may be arranged on flexible tape and, more particularly, to mandrels used in producing such circuits and to the methods of fabrication thereof.

2. Description of the Prior Art

Carriers providing a bump circuit on one surface and a lead circuit on the other are well known in the art. They are used for making electrical contact with the terminals of semiconductor devices such, for example, as integrated circuit chips. The leads provide connections from the semiconductor terminals to other elements. The bumps or pads disposed on the surface opposite the lead circuit serve the purpose of facilitating contact with the semiconductor terminals. This is usually effected by a heat ram for thermally bonding the bumps to the terminals.

It is conventional practice to generate the lead and bump circuits by chemical etching. In other words, a plate of a suitable metal such as copper, for example, is subjected to chemical etching through a photoresist which has been illuminated through a mask and developed to expose the metal at places adjacent the bumps to be provided. As is disclosed in my prior U.S. Pat. No. 4,125,441, assigned to the assignee of the present application, a mandrel is formed which serves to act as a circuit former by providing cavities in which the etch resistant conductive material of the circuit is plated. To complete the fabrication process, the mandrel is finally etched away, leaving the bump circuit tape. Thus, in that process a new mandrel must be prepared for each new bump circuit which is produced.

Reference is made to a patent to Sanz et al, U.S. Pat. No. 3,350,250. This patent relates to a method of making printed wiring circuitry. Specifically, FIGS. 14-18 of the patent disclose a particular fabricating technique for a printed wire circuit. Here a temporary base member is drilled to provide a recess or indentation. This in turn is covered with a layer of conductive material to coat the recess. The conductive material forms a funnel-shaped protrusion which may be inter-nested with others to form electrically conductive interconnections. However, these protrusions are hollow.

Reference is also made to a patent to Pritikin, U.S. Pat. No. 2,692,190. It discloses various fabricating steps, again for making inlaid circuits. It should be noted that these inlaid or printed circuits are not provided with bumps.

The patent to Gigoux, U.S. Pat. No. 3,913,223, discloses a method of manufacturing a double-sided circuit, such as a printed circuit having raised through-hole eyelets shown particularly in FIGS. 3-5, 10 and 11. Basically an aperture is made in a laminated sheet which is then covered with metal to provide a through-hole eyelet. It should be noted that none of these patents relate to the type of bump and lead circuits on a tape to which the present invention is directed.

Other patents relate generally to various circuit fabrication techniques. Thus, the patent to Jackson, Jr., et al, U.S. Pat. No. 3,508,980, relates to an integrated circuit structure. It is made with dielectric isolation. Among others it discloses a chromium layer formed, for example, by vacuum evaporation deposition, which serves as a highly conductive region. This in turn will provide an ohmic contact to transistors.

The two patents to Carbonel, U.S. Pat. Nos. 3,583,066 and 3,566,461, both relate to a method of making a magnetic circuit element.

Finally, reference is made to a patent to Norton, U.S. Pat. No. 3,424,658, which also relates to a process of providing a printed circuit board on a metallic substrate. However, the circuit is not provided with any bumps which are essential to the circuitry provided by mandrels of the present invention.

SUMMARY OF THE INVENTION

In brief, methods and apparatus in accordance with the present invention involve the preparation of a reusable mandrel which is used in the fabrication of bumped tape sheets. These sheets are subsequently etched to develop fine line circuitry with bump contacts selectively positioned on individual leads. Finish plating on the circuit leads may be added, if desired.

In one arrangement in accordance with the present invention, the reusable master mandrel is formed by etching inverse bump cavities in a metal base sheet or plate of a suitable metal such as copper. The base plate is prepared for selective etching by first applying a layer of photoresist material on the base plate and then removing the photoresist in a pattern corresponding to the location of the bumps. Next, the plate is etched in the areas where the photoresist has been removed to develop the bump cavities in the plate. Thereafter, the remaining photoresist is removed and the entire surface of the plate is coated as by plating with a thin layer of nickel. This plated nickel layer coats the surface as well as the etched cavities to develop a form on which a bumped sheet may be built up by plating.

In another arrangement in accordance with the present invention, a reusable master mandrel is prepared by electroforming. A metal sheet or plate is provided as before but in this case photoresist material is located thereon at points where the bumps are to be located. The selective location of the photoresist may be achieved by applying a layer of photoresist to the entire sheet and then selectively removing the photoresist from the plate except in the positions where the bumps are to be. Thereafter, the side of the plate on which the photoresist is located is plated with a suitable material, such as copper, to a thickness corresponding to the desired height of the bumps. Next, the photoresist defining the bump locations is removed so that the plated sheet comprising the mandrel is left with a surface having a plurality of cavities where the photoresist had been. The copper layer is then coated, by plating with a layer of nickel in the manner described for the final step in the preparation of the master mandrel of the first-mentioned arrangement.

The nickel plated layer is bonded to the surface of the master mandrel so that the nickel plated master mandrel retains the previously provided inverse bump pattern. The exposed surface of the nickel plating is then passivated by anodic treatment in a hydroxide ion containing solution to generally render the nickel non-adhering with the later formed bumped sheet, which preferably is copper and which will be plated over the top of the passivated surface. A variety of equivalent techniques can be utilized to passivate the surface of the master mandrel.

After the master mandrel is produced and passivated, the circuit core material is then plated atop the passivated mandrel. The bumped circuit sheet which is thus formed may be separated easily from the mandrel, thus making it possible to reuse the mandrel for production of subsequent circuit sheets. The bumped sheet is then finish etched by suitable application of photoresist and selective etching to produce the desired bump circuitry and, if desired, electroplated with a finish layer of metal such as gold.

BRIEF DESCRIPTION OF THE DRAWINGS

A better understanding of the present invention may be had from a consideration of the following detailed description, taken in conjunction with the accompanying drawings in which:

FIGS. 1A-3A illustrate the preliminary steps of a mandrel fabrication method alternative to that depicted in FIGS. 1-3;

DESCRIPTION OF THE PREFERRED EMBODIMENTS

Figure 1:
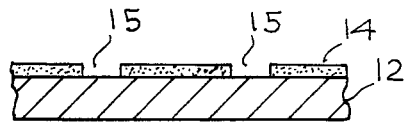
FIGS. 1-3 illustrate the preliminary steps in one particular method of constructing a mandrel in accordance with the present invention for use in fabricating bumped tape circuitry.
Figure 1A:
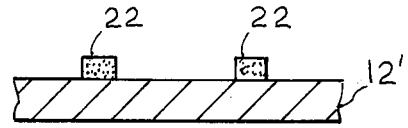
Figure 2:
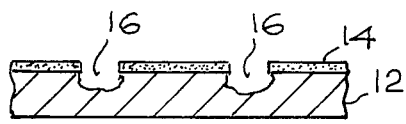
Figure 3:
Figure 4:
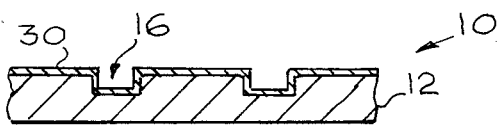
FIG. 4 shows the completion of a mandrel fashioned by the method of FIGS. 1-3 or FIGS. 1A-3A.

Referring now to FIGS. 1-3, one method of producing a reusable master mandrel generally designated by the reference number 10 in FIG. 4 is shown. An etchable metal base sheet or plate 12 is first coated with a layer of photoresist 14. The photoresist 14 is now illuminated with suitable light through a mask in conventional fashion so that certain portions of the photoresist 14 may be removed to form openings 15 in the photoresist 14 where it is desired to form an inverse bump cavity designated as 16 in FIGS. 2 and 3. A suitable chemical etchant is applied to the metal sheet 12 through the openings 15 of photoresist 14 to produce the cavities 16 shown in FIGS. 2 and 3. The photoresist layer 14 is then removed, leaving the etched metal plate 12 as shown in FIG. 3.

As described, the base metal sheet 12 should be of a material which is etchable metal and preferably consists of copper. However, it should be understood that any suitable etchable metal could be substituted for the copper.

Figure 2A:
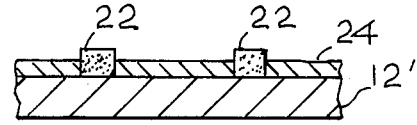
Figure 3A:

Referring now to FIGS. 1A-3A, an alternate method for deriving the reusable master mandrel 10 of FIG. 4 is illustrated. A base metal sheet 12' is provided and spots of photoresist 22 are then developed at selected locations where inverse bump producing cavities are desired. These spots of photoresist 22 are developed by first applying a layer of photoresist material, exposing the material through a mask, and developing the layer and removing the portions which are not exposed, leaving the spots 22. A layer of metal 24, preferably the same type which makes up the base sheet 12', is then electroplated on the surface of the base metal sheet 12' to build up the base metal sheet 12' as shown in FIG. 2A. As seen, the photoresist still remains but, when removed as shown in FIG. 3A, the locations where the photoresist was deposited now define the inverse bump producing cavities 16'.

Thus, alternative processes as illustrated in FIGS. 1-3 and FIGS. 1A-3A, respectively, may be utilized to produce the mandrel 10 of FIG. 4 which is used in fabricating the desired bump and lead circuit. After the base metal sheet 12 or 12' is provided with cavities 16 or 16', depending on the process used for production of the mandrel, the mandrel is completed by plating a nickel layer 30 atop the sheet 12 or 12' (shown as the sheet 12 with inverse bump cavities 16 in FIG. 4). The exposed upper surface of the nickel plating layer 30 is then passivated by anodically treating it with a hydroxide ion containing solution to render it non-adhering with the copper layer 40 which is subsequently plated thereon to form the bumped sheet.

Other passivation techniques may be used. One alternative to the nickel plating and hydroxide ion treatment could be used if the master mandrel 10 were comprised entirely of copper. This alternative involves the oxidation of the upper surface of a copper mandrel 10 which did not include the nickel plating 30 by exposing the copper mandrel to a chromate containing solution to oxidize the copper surface. This would render the mandrel 10 and the plated copper layer 40 generally non-bondable relative to each other.

Figure 5:
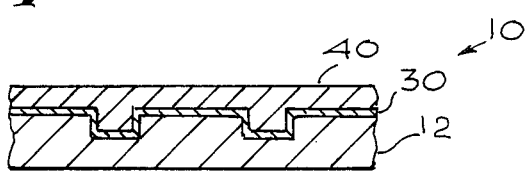
FIGS. 5-6 show the mandrel of FIG. 4 in various stages of producing a bumped sheet.
Figure 6:
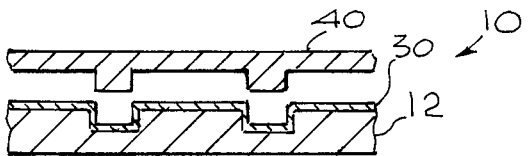
Figure 7:
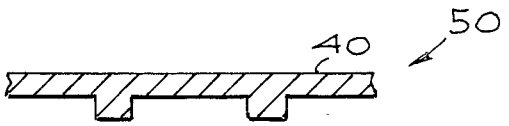
FIG. 7 shows a bumped sheet produced by the mandrel of the present invention.

Returning now to the process of the present invention with the preferred nickel plated mandrel 10, reference is made to FIG. 5 in which the copper bump and lead circuit core material 40 is shown formed by plating atop the upper passivated surface of the mandrel 10. After plating is completed, the copper layer 40 is readily separated by peeling away from the master mandrel 10 as shown in FIG. 6. The resultant structure is shown in FIG. 7 and is a bumped sheet generally designated by the reference numeral 50 which has the desired pattern of bumps thereon. Subsequent treatment of the bumped sheet by known techniques as described hereinabove completes the etching of the sheet 50 to develop the desired fine line bump circuitry.

The process of forming the bumped sheet 50 may now be repeated by going back to the process step illustrated in FIG. 5 and the same mandrel 10 may be reused time and again to produce the bump and lead circuit core plate 50 of FIG. 7 without repetitive costly reproduction of the mandrel, as was required in the fabrication process of my U.S. Pat. No. 4,125,441.

Thus, methods of fabricating a permanent mandrel for use in forming bumped sheets for the production of fine line bumped circuitry result in a substantial saving of both time and money over previously known techniques. Where in the past each bumped sheet was formed on a mandrel which was necessarily etched away in the forming process, thus requiring the fabrication of a separate mandrel for each bumped sheet to be produced, the methods of the present invention provide a mandrel which may be used again and again in the fabrication of the bumped circuit sheets of this invention. This not only reduces the fabrication time required to form a bumped circuit sheet, but also results in a substantial saving of material and reduced cost in producing the mandrels.

Although there have been shown and described above specific arrangements of a permanent mandrel for making bumped tape and methods of forming the same in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. The method of forming a reusable mandrel for producing bumped circuit sheets therefrom comprising the steps of:
   providing a metal base plate;
   forming a plurality of cavities on one surface thereof in a predetermined pattern corresponding to the desired locations of bumps on said sheet by selectively plating regions of the base plate to develop a plated layer with cavities therein;
   plating a thin layer of a metal comprising nickel on said surface to coat the surface and the cavities therein; and
   passivating the exposed surface of the plated layer to render it non-adhering with copper plating.

2. The method of claim 1 further comprising plating selected regions on one side of said plate to establish a plated layer of a predetermined thickness thereon to define cavities having a depth equal to said thickness.

3. The method of claim 2 further including providing photoresist on the surface of said plate at points where said cavities are to be developed prior to the selectively plating step and removing the photoresist after the plating step is completed.

4. The method of claim 3 wherein the step of selectively plating comprises plating said plate in regions not covered by photoresist.

5. The method of claim 3 wherein the step of applying photoresist to the surface of the plate comprises coating the surface with a layer of photoresist to a thickness at least as great as the predetermined thickness of the plated layer, exposing the photoresist through a mask differentiating between the points where the cavities are to be developed and the regions where plating is to be deposited, and removing the photoresist from the regions where the selectively plated layer is to be deposited.

6. The method of claim 1 further comprising plating copper over the nickel plated surface of the mandrel to form a circuit sheet having bumps on the side thereof facing the mandrel in a pattern corresponding to the location of said cavities.

7. The method of claim 6 wherein the circuit sheet is at least as thick as the height of the bumps.

8. The method of claim 6 further including the step of separating the bumped circuit sheet from the mandrel.

9. The method of claim 8 further including the step of selectively etching the circuit sheet to form bumped fine line circuitry.

10. The method of claim 1 wherein the selectively plating step comprises plating regions of the base plate with metal of the same type as the base plate.

11. The method of producing a master mandrel having a desired inverse bumped sheet producing pattern thereon comprising the steps of:
   providing photoresist on the surface of a base plate at points where bump defining cavities are desired;
   selectively plating a layer of metal on the surface of the base plate at regions which are not covered by photoresist to build up the thickness of said base plate and form bump defining cavities in the plated layer;
   electroplating a nickel layer atop the surface of the master mandrel which has the bumped sheet producing pattern thereon;
   anodically treating the exposed surface of the electroplated nickel with a hydroxide ion containing solution to passivate the surface and render the mandrel reusable;
   plating a circuit core material onto the passivated surface to form a bumped circuit sheet having a desired configuration; and
   separating the bumped circuit sheet from the mandrel.

12. The method of claim 11 further including the step of removing the photoresist from the surface of the base plate to open said cavities after the selectively plating step.

13. The method of claim 11 wherein the metal which is selectively plated on the surface of the base plate is of the same type as the metal making up the base plate.

14. A reusable mandrel for the fabrication of bumped fine line circuitry comprising:
   a metal base sheet;
   means comprising selectively built up plated areas on said base sheet defining a plurality of cavities along one surface of the sheet, said cavities being spaced in accordance with a pattern corresponding to the predetermined locations of protruding bumps in a bumped circuit sheet to be produced by the mandrel; and
   a thin layer of a metal comprising nickel plated over said surface and coating the interior surfaces of said cavities, the exposed surface of the plated metal layer being passivated to render it non-adhering with copper plating.

15. The mandrel of claim 14 wherein the base sheet comprises a base plate and a plated layer thereon selectively deposited to provide openings in the plated layer extending to the base plate.

16. The mandrel of claim 14 wherein said base plate and said plated layer thereon are of the same type of metal.

* * * * *